(12) United States Patent
Hynecek

(10) Patent No.: US 7,622,758 B2
(45) Date of Patent: Nov. 24, 2009

(54) CMOS IMAGE SENSOR WITH IMPROVED PERFORMANCE INCORPORATING PIXELS WITH BURST RESET OPERATION

(76) Inventor: Jaroslav Hynecek, 905 Pampa Dr., Allen, TX (US) 75013

( * ) Notice: Subject to any disclaimer, the term of this patent is extended or adjusted under 35 U.S.C. 154(b) by 59 days.

(21) Appl. No.: 11/790,767

(22) Filed: Apr. 27, 2007

(65) Prior Publication Data
US 2007/0257286 A1 Nov. 8, 2007

(30) Foreign Application Priority Data
May 4, 2006 (KR) .................. 10-2006-0040712

(51) Int. Cl.
H01L 31/062 (2006.01)
H01L 31/113 (2006.01)
H01L 29/76 (2006.01)
H01L 29/94 (2006.01)
H01L 31/119 (2006.01)
H01L 31/06 (2006.01)

(52) U.S. Cl. .................. 257/292; 257/341; 257/401; 257/462; 257/E31.001; 257/E31.012; 257/E31.061; 257/E33.001; 257/E33.076; 257/E33.077

(58) Field of Classification Search .................. 257/292, 257/341, 401, 462, E31.001, E31.012, E31.061, 257/E33.001, E33.076, E33.077
See application file for complete search history.

(56) References Cited

U.S. PATENT DOCUMENTS

| 5,192,990 | A  | * | 3/1993 | Stevens ................. 257/229 |
| 6,184,055 | B1 | * | 2/2001 | Yang et al. ............. 438/57 |
| 6,433,373 | B1 |   | 8/2002 | Lee et al. .............. 257/292 |
| 7,132,724 | B1 | * | 11/2006 | Merrill ................ 257/440 |
| 7,323,378 | B2 | * | 1/2008 | Chen et al. ............ 438/199 |
| 7,364,960 | B2 | * | 4/2008 | Lyu .................... 438/204 |
| 7,432,121 | B2 | * | 10/2008 | Brady et al. .......... 438/48 |
| 7,439,561 | B2 | * | 10/2008 | Adkisson et al. ........ 257/233 |
| 2002/0063302 | A1 | * | 5/2002 | Furumiya et al. ....... 257/432 |
| 2002/0190288 | A1 | * | 12/2002 | Lee et al. ............ 257/292 |
| 2006/0138489 | A1 | * | 6/2006 | Ahn et al. ............. 257/292 |
| 2006/0146157 | A1 | * | 7/2006 | Toros et al. ........... 348/308 |
| 2007/0069260 | A1 | * | 3/2007 | Stevens ............... 257/292 |

FOREIGN PATENT DOCUMENTS

| KR | 1020010098144 A | 11/2001 |
| KR | 1020050018512 A | 2/2005 |
| KR | 1020050114752 A | 12/2005 |
| WO | WO 2005/013370 A1 | 2/2005 |

* cited by examiner

Primary Examiner—Ida M Soward
(74) Attorney, Agent, or Firm—McAndrews, Held & Malloy Ltd.

(57) ABSTRACT

A reset transistor includes a floating diffusion region for detecting a charge, a junction region for draining the charge, a gate for controlling a transfer of the charge from the floating diffusion region to the junction region upon receipt of a reset signal, and a potential well incorporated underneath the gate.

16 Claims, 4 Drawing Sheets

FIG. 4
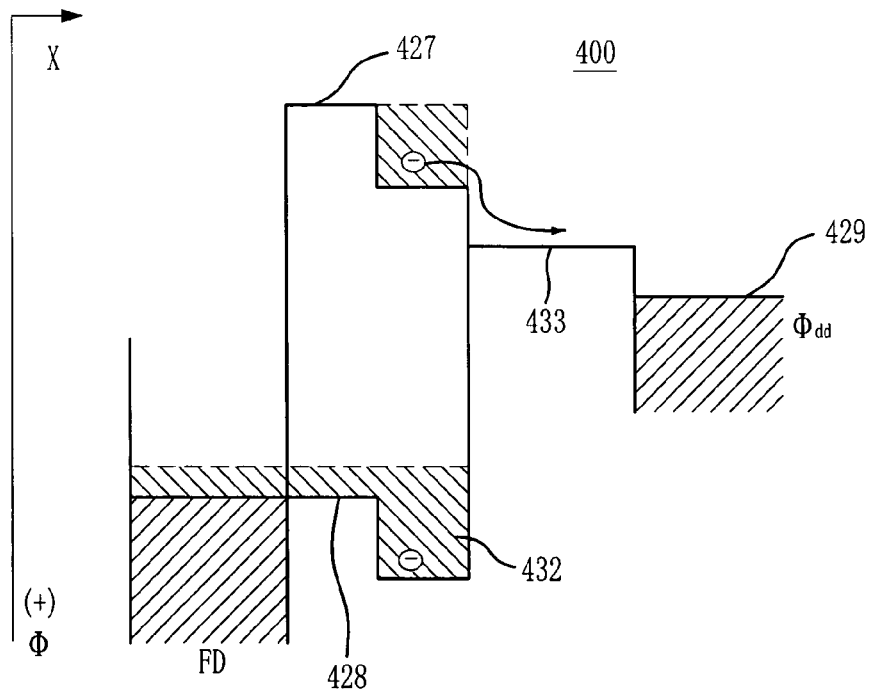
$$v_n = \sqrt{\frac{kT}{C_{fd}}} \cdot \sqrt{\frac{C_w}{C_{fd}+C_w}}$$
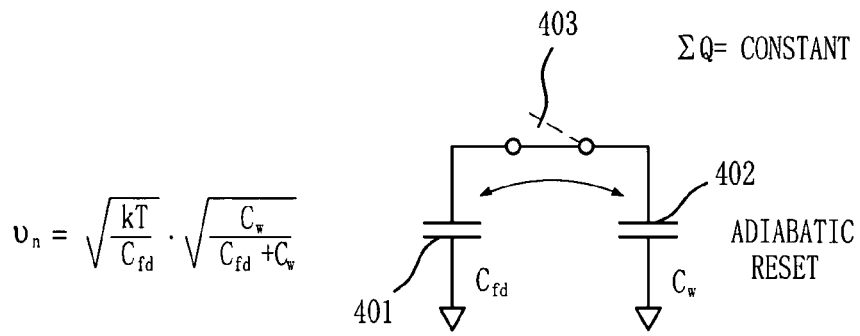
FIG. 5
$$v_n = \sqrt{\frac{kT}{C_{fd}}}$$
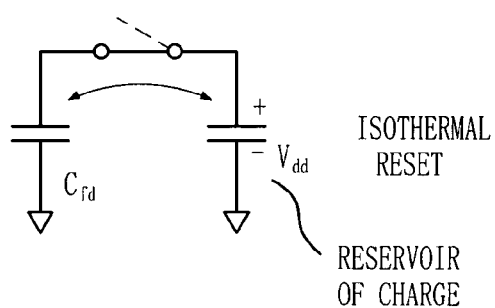

CMOS IMAGE SENSOR WITH IMPROVED PERFORMANCE INCORPORATING PIXELS WITH BURST RESET OPERATION

CROSS-REFERENCE TO RELATED APPLICATIONS

The present invention claims priority of Korean patent application number 10-2006-0040712, filed on May 4, 2006 which is incorporated by reference in its entirety.

BACKGROUND OF THE INVENTION

The present invention relates to a solid-state image sensor, more particularly to a complementary metal oxide semiconductor (CMOS) image sensor improved in performance with high charge well capacity, which results in a higher dynamic range (DR) and an enhanced signal to noise ratio (SNR).

A typical pixel of the CMOS image sensor includes a photodiode, more precisely a pinned photodiode, and four transistors. The photodiode collects a photo-generated charge that is later transferred at a suitable moment by a charge transfer transistor onto a floating diffusion (FD) node which detects the charge. Prior to the charge transfer, however, the FD node must be first reset by a reset transistor to a suitable reference voltage, which is usually a terminal bias voltage, Vdd, or a bias close to this level. The reset causes kTC noise, which is normally added to a signal appearing on the FD node. Thus, it is necessary to read a voltage on the FD node twice, before and after the charge transfer. This operation is called a correlated double sampling (CDS) procedure and the CDS procedure allows sensing of only the voltage difference of the FD node caused by the charge transferred from the photodiode. A source follower (SF) transistor includes a gate coupled to the FD node, a junction node coupled to the Vdd, and another junction node coupled to a common column sense line via an addressing transistor, and senses the voltage of the FD node. For this reason, it is typical to incorporate the four transistors in each pixel of a standard CMOS image sensor. The four transistors (4T) pixel circuit with the pinned photodiode is proposed in U.S. Pat. No. 5,625,210 issued to Lee, entitled "Active Pixel Sensor Integrated with a Pinned Photodiode".

In modern CMOS sensor designs, a circuit for several photodiodes may be shared as can be found for an example in U.S. Pat. No. 6,657,665B1 issued to Guidash, entitled "Active Pixel Sensor with Wired Floating Diffusions and Shared Amplifier". In this patent, a dual pixel includes two photodiodes located in the neighboring rows of a sensor image array and sharing the same circuit. The shared photodiode concept can result in having only two metal bus lines in the row direction and two metal bus lines in the column direction per photodiode as shown in FIG. 1. The shared photodiode concept is very useful for designing small pixels since spacing and width of the metal lines determine a minimum pixel size. The operation of the shared photodiode pixel circuit can be easily understood from a simplified schematic diagram of the circuit 100 shown in FIG. 1. Two photodiodes 101 and 102 are coupled through the respective charge transfer transistors 103 and 104 to a FD node 114 which detects charge. The FD node 114 is reset by a reset transistor 105 to a voltage level appearing on a Vdd node 108. The Vdd node 108 is coupled to a column Vdd bus line 115. Gates of the charge transfer transistors 103 and 104 are biased through the respective horizontal bus lines 110 and 111, and a gate of the reset transistor 105 is biased through a horizontal bus line 109. A gate control signal Tx1 of the charge transfer transistor 103 is transferred through the horizontal bus line 110, and a gate control signal Tx2 of the charge transfer transistor 104 is transferred through the horizontal bus line 111. Also, a gate control signal Rx of the reset transistor 105 is transferred through the horizontal bus line 109. The FD node 114 is coupled to a gate of a source follower (SF) transistor 106 that senses a voltage on the FD node 114. An output of the SF transistor 106 is coupled through an addressing transistor 107 to a common column sense line 113. A horizontal bus line 112 controls a bias of the addressing transistor 107. A gate control signal Sx of the addressing transistor 107 is transferred through the horizontal bus line 112. As shown in FIG. 1, there are only two vertical (column) lines, a Vdd bus line 115 and a column sense line 113. There are also only two horizontal lines per photo site.

It is possible to eliminate the charge transfer transistor from the 4T pixel and thus, obtain a three transistors (3T) pixel. Also, it is possible to eliminate one of the charge transfer transistors 103 and 104 from the shared pixel shown in FIG. 1 and keep the other one in place, thereby obtaining a combination of a 3T-4T shared pixel. However, the CDS procedure may not be used to minimize the reset noise in the 3T pixel and thus, other techniques known in the art have been required.

In order to better understand the operation of the 4T pixel, FIG. 2 illustrates a cross-sectional view of a simplified device. The simplified device 200 includes a single pinned photodiode 205, and a charge transfer transistor and a reset transistor corresponding to the photodiode 205. A source follower (SF) transistor 201 and an addressing transistor 202 are shown only schematically including connections of the SF transistor 201 and the addressing transistor 202 to the corresponding circuit nodes. A junction node of the SF transistor 201 is coupled to a bus line 231. FIG. 2 also includes a potential diagram 206 of the simplified device 200, and the potential diagram 206 illustrates a charge transfer flow from the photodiode into a FD node 203 and finally into an $N^+$-type impurity doped junction region 204 (in this case, functioning as a drain) during charge reset. A pixel is formed in a P-type silicon substrate 219 that has pixel isolation trenches 207 formed in the P-type silicon substrate 219 and filled by an oxide 210. Another oxide layer 218 is grown on a top portion of the substrate 219 that isolates a gate 211 of a charge transfer transistor and a gate 212 of a reset transistor from the substrate 219. The gates 211 and 212 of the charge transfer transistor and the reset transistor are coupled to the respective horizontal bus lines 213 and 214 that supply a required bias to the gates 211 and 212. Gate control signals Tx and Rx of the charge transfer transistor and the reset transistor are transferred through the horizontal bus lines 213 and 214, respectively. The pinned photodiode 205 is formed in the substrate 219 by a $P^+$-type diffusion region 208 that extends along a sidewall of each of the trenches 207 all the way to the P-type substrate 219 and by an N-type diffusion region 209. It is also possible to use more sophisticated doping profiles as is well known to those skilled in this art. The charge transfer transistor with the gate 211 connects the pinned photodiode to the FD node 203, and the reset transistor with the gate 212 connects the FD node 203 to the junction region 204 doped with the $N^+$-type impurity.

As can be seen from the potential diagram 206 that is located under the cross-sectional view of the simplified device 200 in FIG. 2, potential levels of the potential diagram 206 correspond to each device built into the substrate 219, and the pinned photodiode forms a potential well that accumulates a signal charge 221 during the time when the gate 211 of the charge transfer transistor is off. The off state of the gate 211 of the charge transfer transistor is indicated in the potential diagram 216 by a potential level 222. An overflow charge (blooming current) from the potential well flows via a path 230 through the reset transistor directly to the junction region 204. When the charge transfer transistor is turned on, the potential level 222 under the charge transfer transistor changes to a potential level 223, and the signal charge 221 flows into the FD node 203. The signal charge transferred into the FD node 203 is indicated by a reference numeral 224. The signal charge 224 causes a potential level 225 of the FD node 203 to change to a new potential level 226. The new potential level 226 represents a voltage signal that is sensed by the SF transistor 201. When applying an appropriate bias, i.e., a gate control signal Sx, to a gate of the addressing transistor 202 through a bus line 215, the addressing transistor 202 is turned on and the voltage signal from the SF transistor 201 is transferred to a pixel output bus 216.

The pixel is reset by applying a single reset pulse 217 to the horizontal bus line 214 coupled to the gate 212 of the reset transistor. The pixel reset changes a potential level 227 under the reset transistor to a new potential level 228, which allows the signal charge 224 to flow into the junction region 204 doped with the $N^+$-type impurity. The junction region 204 is biased at a Vdd potential level 229, which is fixed by an external device power source and cannot change. Thus, when all the signal charge 224 is transferred to the junction region 204, the FD node 203 resumes the original potential level 225 of the FD node 203. The potential level 225 of the FD node 203 is only approximately equal to the Vdd potential level 229 due to a reset feed through from the gate 212 of the reset transistor and kTC-reset noise. It is therefore desirable to use the CDS procedure to sample both of the potential levels 225 and 226 since a true photo-generated signal is the difference between these two potential levels.

As is now clear from the potential diagram 206, a FD voltage swing is limited on a high side by the Vdd potential level 229 and on a low side by an empty pinned photodiode level 220 of the pinned photodiode. When too much signal accumulates in the photodiode, not all of the signal can be transferred into the FD node 203, which results in the lower dynamic range and increased noise. It is desirable to have a large voltage swing on the FD node 203 and thus decrease the pinned photodiode level 220, i.e., a pinning voltage level of the pinned photodiode. However, the low pinning voltage level results in low photodiode charge storage capacity, thereby causing a low dynamic range (DR) and a low signal to noise ratio (SNR). Accordingly, it is necessary to find a suitable compromise between these two competing requirements. This compromise then determines an ultimate performance of the pixel that is clearly determined by the maximum Vdd potential level 229 that can be used in the sensor. To have a large Vdd potential level is a disadvantage, since the large Vdd potential level increases the sensor power consumption.

SUMMARY OF THE INVENTION

Embodiments of the present invention are directed to provide a practical pixel design that can be used in a small pixel and a CMOS image sensor array with a high performance.

In accordance with one aspect of the present invention, there is provided a reset transistor, including: a floating diffusion region for detecting a charge; a junction region for draining the charge; a gate for controlling a transfer of the charge from the floating diffusion region to the junction region upon receipt of a reset signal; and a potential well incorporated underneath the gate.

In accordance with another aspect of the present invention, there is provided a pixel of an image sensor, the pixel including: a photodiode; a resetting device comprising a reset transistor, the reset transistor including: a floating diffusion region for detecting a charge; a junction region for draining the charge; a gate for controlling a transfer of the charge from the floating diffusion region to the junction region upon receipt of a reset signal; and a potential well incorporated underneath the gate.

In accordance with further aspect of the present invention, there is provided a shared photo site pixel, including: a photodiode coupled to a floating diffusion region in parallel; and a reset transistor for resetting the floating diffusion region, the reset transistor including: a junction region for draining a charge; a gate for controlling a transfer of the charge from the floating diffusion region to the junction region upon receipt of a reset signal; and a potential well incorporated underneath the gate.

BRIEF DESCRIPTION OF THE DRAWINGS

FIG. 4 illustrates a simplified potential diagram showing a circuit model corresponding to an adiabatic reset which reduces kTC noise in accordance with another embodiment of the present invention.

FIG. 5 illustrates a simplified schematic diagram of a standard isothermal reset which exhibits normal kTC noise in accordance with another embodiment of the present invention.

DESCRIPTION OF SPECIFIC EMBODIMENTS

According to embodiments of the present invention, a reset concept does not limit a floating diffusion (FD) node which detects charge to be reset at a Vdd bias level but at a level which is significantly above the Vdd bias level. The reset is performed by adding N burst reset pulses instead of adding a single reset pulse to a reset transistor, wherein N is greater than 1. Furthermore, the reset transistor can be modified to include a potential well underneath a gate of the reset transistor. As a result, a junction region of the reset transistor is not directly coupled to the Vdd but via a potential barrier. This modification of the reset transistor allows the charge to be pumped up from the FD node to a level above the Vdd bias level and thus, achieve much higher reset voltage level than the Vdd. In addition, according to the embodiments of the present invention, a charge-pumping concept which reduces the kTC noise is shown. A typical reset can be compared with an isothermal equilibrium of the FD node having a charge reservoir, which generates kTC noise. The new charge-pumping reset according to the embodiment of the present invention can be compared with an adiabatic charge transfer as a reservoir which has a reduced level of noise. The new charge-pumping reset is very advantageous when a three transistors (3T) pixel is used or a combination of shared 3T-4T pixels is used in an image sensor array.

According to the embodiments of the present invention, the burst of the reset pulses is used instead of the single reset pulse transferred to the gate of the reset transistor. To use the burst of the reset pulses allows the FD node to be reset at a level significantly above the Vdd bias level and thus, simultaneously increase a photodiode charge storage capacity level and a FD voltage swing. The increase in the photodiode charge storage capacity and the FD voltage swing can be obtained by incorporating a special potential well underneath the gate of the reset transistor and a special pinned potential barrier between the reset transistor and a Vdd node doped with an $N^+$-type impurity. As the result of the embodiments of the present invention, a complementary metal oxide semiconductor (CMOS) sensor array can have a very small sized pixel, a large charge storage capacity, a high dynamic range, and a high signal to noise ratio. Hereinafter, the embodiments of the present invention will be described in more detail with reference to FIGS. 3 to 5.

Figure 1:
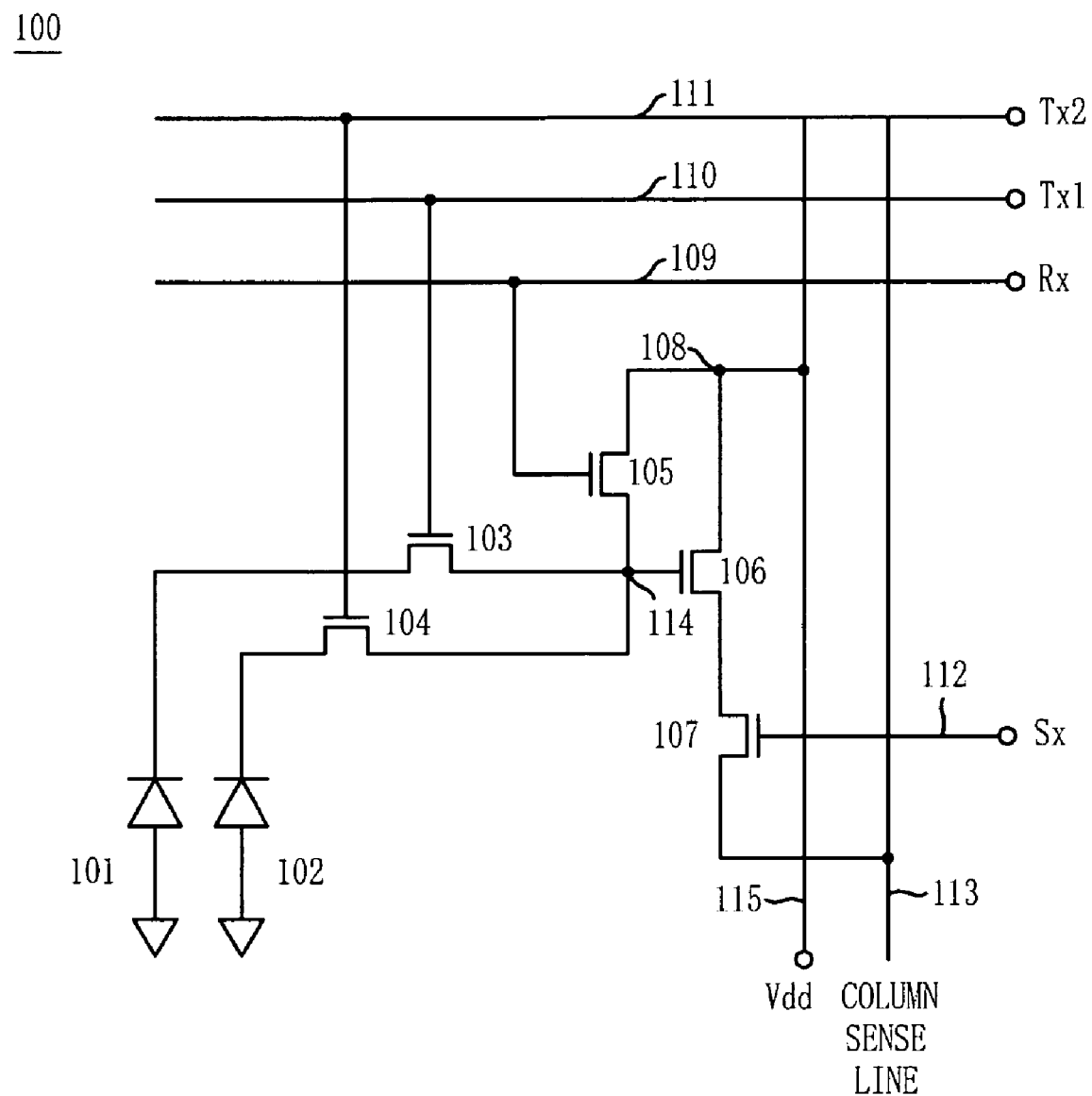
FIG. 1 illustrates a simplified schematic diagram of a typical row-shared pixel circuit having two pinned photodiodes per circuit and operating based on a four transistors (4T) pixel principle.
Figure 2:
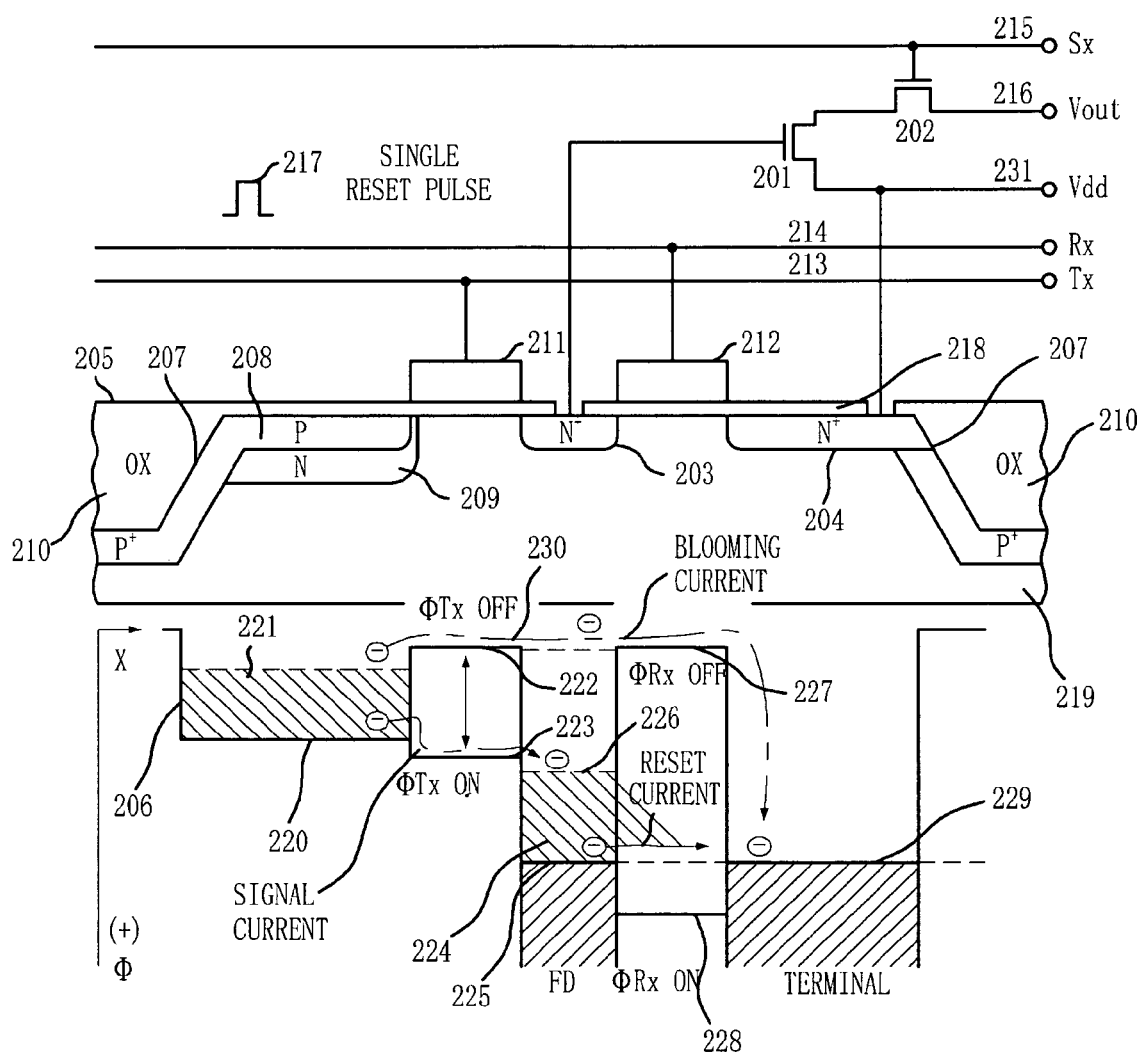
FIG. 2 illustrates a simplified schematic diagram of a typical pixel including a potential diagram showing a flow of an accumulated signal, and a cross-sectional view of a photodiode, a charge transfer transistor, and a reset transistor.
Figure 3:
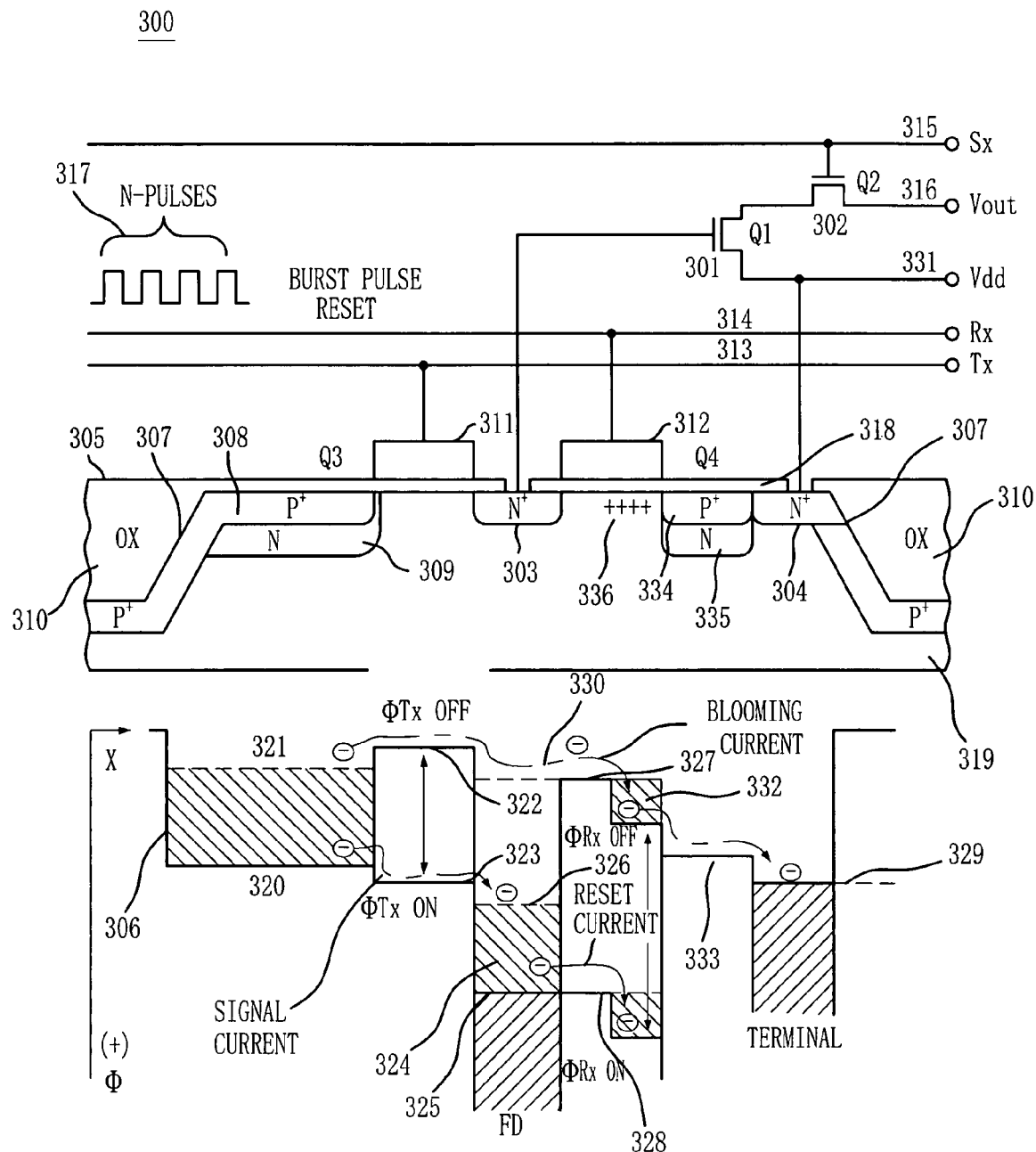
FIG. 3 illustrates a simplified schematic diagram of a pixel including a potential diagram showing a flow of an accumulated signal, and a cross-sectional view of a photodiode, a charge transfer transistor, a reset transistor, and a potential barrier adjacent to a junction region in accordance with an embodiment of the present invention.

FIG. 3 illustrates a cross-sectional view of a simplified device in accordance with an embodiment of the present invention. The simplified device 300 includes a single pinned photodiode structure 305, and a charge transfer transistor and a reset transistor corresponding to the pinned photodiode structure 305. A source follower (SF) transistor 301 and an addressing transistor 302 are shown only schematically including connections of the SF transistor 301 and the addressing transistor 302 to the corresponding circuit nodes. An $N^+$-type impurity doped junction region 304, which functions as a drain according to the present embodiment, and a junction node of the SF transistor 301 are coupled to a bus line 331 to supply a bias Vdd. The simplified device 300 also includes a potential diagram 306. The potential diagram 306 illustrates a charge transfer flow from a photodiode well into a FD node 303 and finally into the junction region 304 during the charge reset. The pixel is isolated by trenches 307 formed through a shallow trench isolation (STI) process in a P-type silicon substrate 319. The trenches 307 are filled with an oxide 310. Another oxide layer 318 is grown on a top portion of the substrate 319 that isolates a gate 311 of a charge transfer transistor and a gate 312 of a reset transistor from the substrate 319. The gate 311 of the charge transfer transistor and the gate 312 of the reset transistor are coupled to the respective horizontal bus lines 313 and 314 that supply the required biases to the gates 311 and 312. Gate control signals Tx and Rx of the charge transfer transistor and the reset transistor are transferred through the horizontal bus lines 313 and 314, respectively. The pinned photodiode 305 is formed in the substrate 319 by a $P^+$-type diffusion region 308 that extends along a sidewall of each of the trenches 307 all the way to the P-type substrate 319 and by an N-type diffusion region 309. The charge transfer transistor with the gate 311 connects the pinned photodiode 305 to the FD node 303 and the reset transistor with the gate 312 connects the FD node 303 to the junction region 304 via a potential barrier, more particularly, a pinned potential barrier including a $P^+$-type diffusion region 334 and an N-type diffusion region 335. This pinned potential barrier is a junction gate field-effect transistor (JFET) including a gate coupled to a substrate, one junction region being virtual, and another junction region shared with the junction region 304 of the reset transistor. The reset transistor has an additional N-type implantation region 336 (a doped region) formed underneath the gate 312 of the reset transistor, thereby forming a potential well. The potential well is formed on the side of the junction region 304 inside the substrate 319 underneath the gate 312 of the reset transistor. The JFET and the pinned photodiode 305 can be simultaneously formed during the fabrication process and thus, pinned potential levels 320 and 333 can be substantially the same.

As can be seen from the potential diagram 306 shown under the cross-sectional view of the simplified device 300, potential levels corresponding to each device that is built into the substrate 319 are shown. The pinned photodiode 305 forms a pinned photodiode potential well 320 that accumulates a signal charge 321 during the time when the gate 311 of the charge transfer transistor is turned off. The off state of the gate 311 of the charge transfer transistor is indicated in the potential diagram 306 by a potential level 322. An overflow charge (a blooming current) from the potential well 320 flows via a path 330 directly to the junction region 304. When the gate 311 of the charge transfer transistor is turned on, the potential level 322 under the gate 311 of the charge transfer transistor changes to a potential level 323, and the signal charge 321 flows into the FD node 303 doped with an $N^+$-type impurity. The signal charge transferred into the FD node 303 is indicated by a reference numeral 324. Accordingly, a potential level 325 under the FD node 303 is changed to a new potential level 326. The new potential level 326 is a voltage signal sensed by the SF transistor 301. When applying an appropriate bias to the gate of the address transistor 302 through a bus line 315, the address transistor 302 is turned on, and the voltage signal is transferred from the SF transistor 201 to a pixel output bus line 316.

According to the embodiment of the present invention, a new pixel is reset in the different way from the reset of the typical pixel. The new pixel is reset by applying a burst of rest pulses 317 to the bus line 314, which transfers the gate control signal Rx to the gate 312 of the reset transistor. The burst of the reset pulses 317 periodically changes a potential level 327 underneath the gate 312 of the reset transistor to a new potential level 328 and vice versa. This process allows a portion of the signal charge 324 to flow into a potential well 332 formed underneath the gate 312 of the reset transistor by placing a suitable implantation region 336 underneath the gate 312 of the reset transistor. The potential well 332 is filled up and a potential level of the potential well 332 is raised above a potential level 333 of the pinned potential barrier during a negative reset pulse transition. Accordingly, the signal charge in the potential well 332 under the gate 312 of the reset transistor flows out over the pinned potential barrier and into the junction region 304, which is at a potential level 329. The sufficient repetition of this process empties the signal charge of the FD node 303 and brings the potential level of the FD node 303 back to the approximately original potential level 325. Since the junction region 304 remains biased at an original Vdd level 329, it is clear from the diagram 306 that the FD node 303 can be reset at a level above the Vdd level 329 when the amplitude of the reset pulses and the depth of the potential well of the gate 312 of the rest transistor are suitably selected.

As is now clear from the potential diagram 306, the FD voltage swing can be higher and not be limited on the high side by the Vdd level 329. The low side remains limited by the potential level 320, i.e., an empty pinned photodiode potential level. However, the pinned photodiode level 320 can now be significantly increased in comparison to the typical pinned photodiode level. As a result, a charge storage capacity level and a voltage swing of the FD node 303 can be increased, and a pixel performance can be significantly improved without any significant penalty to the power consumption of an image sensor or a silicon chip area.

The burst-reset concept has another advantage of low reset noise. FIG. 4 illustrates a simplified potential diagram showing a circuit model corresponding to an adiabatic reset which reduces kTC noise in accordance with another embodiment of the present invention. As shown in FIG. 4, a charge-pumping operation from a potential level 428 to a potential level 427 and the potential diagram can be represented by the circuit model consisting of a floating diffusion capacitance $C_{fd}$ 401 coupled through a switch 403 to another smaller capacitance $C_f$ 402 representing a rest transistor well 432. As is well known in the art, the reset noise appearing on the floating diffusion capacitance $C_{fd}$ 401 of the circuit configuration after a repeated opening and closing of the switch 403 is expressed by the following equation 1.

$$V_n = \sqrt{\frac{kT}{C_{fd}}} \sqrt{\frac{C_w}{C_{fd}+C_w}} \qquad \text{Eq. 1}$$

FIG. 5 illustrates a simplified schematic diagram of a standard isothermal reset which exhibits normal kTC noise in accordance with another embodiment of the present invention. For the case of the $C_{fd}$ reset to a voltage source as shown in FIG. 5, the reset noise is expressed by the following equation 2.

$$V_n = \sqrt{\frac{kT}{C_{fd}}} \qquad \text{Eq. 2}$$

This difference in the reset noise equations 1 and 2 can be understood by making the analogy with a heat transfer. In the case of the reset to the voltage source, the charge is supplied from an infinite charge reservoir. The supply of the charge from the infinite charge reservoir can be made analogous to an isothermal process with an infinite heat reservoir. In the case of a reset to a small capacitor, the charge in the circuit is a quasi constant isolated from the infinite charge reservoir. Thus, the reset to the small capacitor is similar to an adiabatic process. By making a capacitor $C_w$ in Eq. 1 much smaller than the capacitor $C_{fd}$ in Eq. 1, a substantial reduction in the kTC noise can be expected. Also, when the capacitance $C_w$ becomes infinite, the eq. 1 reverts to the standard case of the reset to the voltage as can be expected.

This improvement in the kTC noise becomes valuable in the 3T pixel sensors, or in the combination of the shared concept with the 3T and 4T pixels as mentioned above, which are described in FIGS. 4 and 5.

According to the embodiments of the present invention described in FIGS. 4 and 5, the pinned photodiode and the charge transfer transistor are not included. The signal is directly integrated on the FD node 303. After the integration and the readout, the FD node 303 is reset above the Vdd level 329 by the described charge-pumping concept. Since the charge-pumping reset does not generate the kTC reset noise, it is sufficient to read the signal only once and thus, eliminate the CDS procedure. It may be advantageous to reset the FD node 303 first to a Vdd level 329 generating kTC noise and then, pump the charge up to a higher level to make sure that the process always starts the same way without having any memory of the previous pixel signal. This will not be discussed in any more detail in the detailed description since such concepts are well known in the art.

According to the embodiments of the present invention, a novel pixel generating a higher dynamic range and a better signal to noise ratio, and having a higher voltage swing and a larger well capacity is described. The novel pixel can be obtained by using the burst reset and incorporating the special potential well into the reset transistor and the JFET (i.e., the pinned potential barrier) next to the reset transistor. This improvements and innovations are not intended to limit but to be illustrative. Also, persons skilled in this art can make modifications and variations in light of the above teaching. It is therefore to be understood that changes may be made in the particular embodiment of the present invention disclosed, which are within the scope and sprit of the invention as defined by appended claims.

According to the embodiment of the present invention, a burst of the reset pulse is used instead of using the single reset pulse added to the gate of the reset transistor. To use the burst of the reset pulse allows resetting the FD node above the Vdd level. Thus, the photodiode charge capacity and the FD voltage switching can be simultaneously increased by incorporating the special potential well to the gate of the reset transistor and the special pinned potential barrier between the reset transistor and the N+-type Vdd node. As the result, as compared with the conventional CMOS image sensor, a CMOS image sensor having a larger charge capacity, a higher dynamic range, a larger signal to noise ratio, and a small sized pixel can be fabricated.

While the present invention has been described with respect to the specific embodiments, it will be apparent to those skilled in the art that various changes and modifications may be made without departing from the spirit and scope of the invention as defined in the following claim.

What is claimed is:

1. A reset transistor, comprising:
   a floating diffusion region for detecting a charge;
   a junction region for draining the charge;
   a gate for controlling a transfer of the charge from the floating diffusion region to the junction region upon receipt of a reset signal;
   a potential well incorporated underneath the gate; and
   a pinned potential barrier formed between the potential well and the junction region, including a first diffusion region of a first type and a second diffusion region of a second type forming a junction field-effect transistor having a gate connected to a substrate, and one junction region shared with the junction region.

2. The reset transistor of claim 1, wherein the potential well is formed on the side of the junction region inside a substrate underneath the gate.

3. The reset transistor of claim 1, wherein the reset signal comprises a burst reset signal.

4. The reset transistor of claim 1, wherein the potential well is an impurity doped region disposed inside the substrate underneath the gate.

5. A pixel of an image sensor, the pixel comprising:
   a photodiode; and
   a resetting device comprising a reset transistor, the reset transistor comprising:
      a floating diffusion region for detecting a charge;
      a junction region for draining the charge;
      a gate for controlling a transfer of the charge from the floating diffusion region to the junction region upon receipt of a reset signal;
      a potential well incorporated underneath the gate; and
      a pinned potential barrier, formed between the potential well and the junction region, including a first diffusion region of a first type and a second diffusion region of a second type forming a junction field-effect transistor having a gate connected to a substrate, and one junction region shared with the junction region.

6. The pixel of claim 5, further comprising:
a source follower transistor for amplifying a photo-generated charge of the floating diffusion region; and
an addressing transistor for selecting an output of the source follower transistor and providing the output of the source follower transistor as a pixel output.

7. The pixel of claim 5, further comprising:
a transfer transistor for transferring the photo-generated charge of the photodiode to the floating diffusion region;
a source follower transistor for amplifying the charge of the floating diffusion region; and
an addressing transistor for selecting an output of the source follower transistor and providing the output of the source follower transistor as a pixel output.

8. A shared photo site pixel, comprising:
a photodiode coupled to a floating diffusion region in parallel; and
a reset transistor for resetting the floating diffusion region, the reset transistor comprising:
a junction region for draining a charge;
a gate for controlling a transfer of the charge from the floating diffusion region to the junction region upon receipt of a reset signal;
a potential well incorporated underneath the gate; and
a pinned potential barrier, formed between the potential well and the junction region, including a first diffusion region of a first type and a second diffusion region of a second type forming a junction field-effect transistor having a gate connected to a substrate, and one junction region shared with the junction region.

9. The shared photo site pixel of claim 8, wherein the potential well is formed on the side of the junction region inside the substrate underneath the gate.

10. The shared photo site pixel of claim 8, wherein the reset signal comprises a burst reset pulse.

11. The shared photo site pixel of claim 8, wherein the potential well is an impurity doped region disposed inside the substrate underneath the gate.

12. The shared photo site pixel of claim 8, wherein the potential barrier has substantially the same pinned potential as the photodiode.

13. The shared photo site pixel of claim 8, further comprising a plurality of charge transfer gates for controlling a transfer of the charge from the photodiode to the floating diffusion region.

14. The shared photo site pixel of claim 13, wherein the potential well is formed on the side of the junction region inside the substrate underneath the gate.

15. The shared photo site pixel of claim 13, wherein the reset signal comprises a burst reset pulse.

16. The shared photo site pixel of claim 13, wherein the potential well is an impurity doped region disposed inside the substrate underneath the gate.

* * * * *